(12) United States Patent
Liu et al.

(10) Patent No.: US 11,662,384 B2
(45) Date of Patent: May 30, 2023

(54) MOTOR MALFUNCTION MONITORING DEVICE, DRIVE MOTOR SYSTEM AND MOTOR MALFUNCTION MONITORING METHOD

(71) Applicant: YANTAI JEREH PETROLEUM EQUIPMENT & TECHNOLOGIES CO., LTD., Yantai Shandong (CN)

(72) Inventors: Kaishen Liu, Yantai Shandong (CN); Shouzhe Li, Yantai Shandong (CN); Haiping Xing, Yantai Shandong (CN); Zhuqing Mao, Yantai Shandong (CN); Weiwei Liu, Yantai Shandong (CN); Liang Li, Yantai Shandong (CN); Dawei Zhao, Yantai Shandong (CN); Jun Zhang, Yantai Shandong (CN)

(73) Assignee: YANTAI JEREH PETROLEUM EQUIPMENT & TECHNOLOGIES CO., LTD., Yantai (CN)

( * ) Notice: Subject to any disclaimer, the term of this patent is extended or adjusted under 35 U.S.C. 154(b) by 53 days.

(21) Appl. No.: 17/155,966

(22) Filed: Jan. 22, 2021

(65) Prior Publication Data
US 2022/0155373 A1 May 19, 2022

(30) Foreign Application Priority Data

Nov. 13, 2020 (CN) .......................... 202011273318.9
Nov. 13, 2020 (CN) .......................... 202022639085.1

(51) Int. Cl.
*G01R 31/34* (2020.01)
*G08B 21/18* (2006.01)
(Continued)

(52) U.S. Cl.
CPC ............ *G01R 31/343* (2013.01); *E21B 41/00* (2013.01); *G08B 21/185* (2013.01); *H02P 29/024* (2013.01)

(58) Field of Classification Search
CPC ..... G01R 31/343; E21B 41/00; G08B 21/185; H02P 29/024; H02H 7/00
See application file for complete search history.

(56) References Cited

U.S. PATENT DOCUMENTS

| 3,794,377 A | 2/1974 | Wachsmuth et al. |
| 3,815,965 A | 6/1974 | Ostwald |

(Continued)

FOREIGN PATENT DOCUMENTS

| CN | 1154765 A | 7/1997 |
| CN | 102704895 A | 10/2012 |

(Continued)

OTHER PUBLICATIONS

International Search Report dated Aug. 23, 2021, for International Application No. PCT/CN2020/137135, 4 pages.

(Continued)

*Primary Examiner* — Akm Zakaria

(57) ABSTRACT

The present disclosure relates to a motor malfunction monitoring device, and a drive motor for oilfield operations including: a signal acquisition module configured to acquire operation data of the drive motor, wherein the signal acquisition module comprises a vibration signal acquisition unit and/or an electrical signal acquisition unit, the vibration signal acquisition unit comprises one or more vibration sensors mounted at a component to be detected of the drive motor during use and provided for detecting transverse vibration and/or longitudinal vibration, and/or the electrical signal acquisition unit comprises a voltage sensor and a current sensor for detecting a voltage and a current of the drive motor, respectively; a data storage module storing (Continued)

therein a database of normal operation spectrums created when the drive motor runs normally; and a signal analysis module configured to extract an acquired operation data spectrum of the operation data acquired, compare the acquired operation data spectrum with a respective normal operation data spectrum in the database of normal operation spectrums to obtain a similarity, and determine that the drive motor fails when the similarity is less than a predetermined threshold.

12 Claims, 3 Drawing Sheets

(51) Int. Cl.
*H02P 29/024* (2016.01)
*E21B 41/00* (2006.01)

(56) References Cited

U.S. PATENT DOCUMENTS

| | | | |
|---|---|---|---|
| 4,201,523 A | 5/1980 | Olofsson | |
| 4,793,775 A | 12/1988 | Peruzzi | |
| 5,519,300 A * | 5/1996 | Leon | G01R 31/343 318/729 |
| 5,767,591 A | 6/1998 | Pinkerton | |
| 5,846,056 A | 12/1998 | Dhindsa et al. | |
| 6,134,878 A | 10/2000 | Amako et al. | |
| 8,731,793 B2 | 5/2014 | Barbir et al. | |
| 10,648,311 B2 | 5/2020 | Oehring et al. | |
| 10,865,624 B1 | 12/2020 | Cui et al. | |
| 10,873,099 B1 | 12/2020 | Gurunathan et al. | |
| 10,914,155 B2 | 2/2021 | Oehring et al. | |
| 11,109,508 B1 | 8/2021 | Yeung et al. | |
| 11,125,066 B1 | 9/2021 | Yeung et al. | |
| 11,208,878 B2 | 12/2021 | Oehring et al. | |
| 11,220,895 B1 | 1/2022 | Yeung et al. | |
| 11,378,008 B2 | 7/2022 | Yeung et al. | |
| 11,391,136 B2 | 7/2022 | Coli et al. | |
| 11,434,737 B2 | 9/2022 | Oehring et al. | |
| 11,459,863 B2 | 10/2022 | Robinson et al. | |
| 11,542,786 B2 | 1/2023 | Hinderliter et al. | |
| 2003/0007369 A1 | 1/2003 | Gilbreth et al. | |
| 2003/0064858 A1 | 4/2003 | Saeki et al. | |
| 2005/0093496 A1 | 5/2005 | Tokunou et al. | |
| 2005/0241884 A1 * | 11/2005 | Ghanemi | B66B 5/02 187/293 |
| 2010/0045237 A1 | 2/2010 | Liu | |
| 2010/0135840 A1 | 6/2010 | Fujimoto et al. | |
| 2013/0184884 A1 | 7/2013 | More et al. | |
| 2013/0255153 A1 | 10/2013 | Sasaki et al. | |
| 2014/0167810 A1 * | 6/2014 | Neti | G01R 31/343 324/765.01 |
| 2014/0219824 A1 | 8/2014 | Burnette | |
| 2015/0260794 A1 * | 9/2015 | Athikessavan | G01R 31/343 702/58 |
| 2015/0349387 A1 | 12/2015 | Inaba et al. | |
| 2016/0041066 A1 | 2/2016 | Patenaude et al. | |
| 2016/0121871 A1 | 5/2016 | Lee | |
| 2016/0358311 A1 | 12/2016 | Chen et al. | |
| 2017/0159425 A1 | 6/2017 | Wood et al. | |
| 2017/0285062 A1 | 10/2017 | Kim | |
| 2018/0145511 A1 | 5/2018 | Biellmann | |
| 2018/0328157 A1 | 11/2018 | Bishop | |
| 2019/0100989 A1 | 4/2019 | Stewart et al. | |
| 2019/0128265 A1 | 5/2019 | Washio et al. | |
| 2019/0169971 A1 | 6/2019 | Oehring et al. | |
| 2019/0195292 A1 | 6/2019 | Pan et al. | |
| 2020/0040878 A1 | 2/2020 | Morris | |
| 2020/0049136 A1 | 2/2020 | Stephenson | |
| 2020/0325760 A1 | 10/2020 | Markham | |
| 2021/0040830 A1 | 2/2021 | Mu et al. | |
| 2021/0095552 A1 | 4/2021 | Oehring et al. | |
| 2021/0095648 A1 | 4/2021 | Buckley et al. | |
| 2021/0102451 A1 | 4/2021 | Robinson et al. | |
| 2021/0102530 A1 | 4/2021 | Pruitt et al. | |
| 2021/0108489 A1 | 4/2021 | Shampine | |
| 2021/0199161 A1 | 7/2021 | Eto et al. | |
| 2021/0310341 A1 | 10/2021 | Sherman et al. | |
| 2022/0004179 A1 * | 1/2022 | Badkoubeh | G05B 23/024 |
| 2022/0018232 A1 | 1/2022 | Oehring et al. | |
| 2022/0213777 A1 | 7/2022 | Cui et al. | |
| 2022/0364448 A1 | 11/2022 | Oehring et al. | |

FOREIGN PATENT DOCUMENTS

| | | |
|---|---|---|
| CN | 103456141 A | 12/2013 |
| CN | 103913193 A | 7/2014 |
| CN | 105337397 A | 2/2016 |
| CN | 105352588 A | 2/2016 |
| CN | 107245857 A | 11/2017 |
| CN | 108360818 A | 8/2018 |
| CN | 208337176 U | 1/2019 |
| CN | 109765484 A | 5/2019 |
| CN | 110932362 A | 3/2020 |
| CN | 210745048 U | 6/2020 |
| CN | 112993965 A | 6/2021 |
| CN | 113417737 A | 9/2021 |
| CN | 214227909 U | 9/2021 |
| CN | 214786070 U | 11/2021 |
| CN | 215621353 U | 1/2022 |
| EP | 2290776 A1 | 3/2011 |
| KR | 20210087308 A | 7/2021 |

OTHER PUBLICATIONS

International Search Report dated Aug. 13, 2021, for International Application No. PCT/CN2020/137300, 5 pages.
Non-Final Office Action for U.S. Appl. No. 17/747,916 dated Aug. 18, 2022.
Non-Final Office Action for U.S. Appl. No. 17/733,922 dated Sep. 21, 2022.
Final Office Action for U.S. Appl. No. 17/747,916 dated Nov. 10, 2022.
Non-Final Office Action for U.S. Appl. No. 17/884,358 dated Dec. 8, 2022.
Final Office Action for U.S. Appl. No. 17/733,922 dated Dec. 28, 2022.
Written Opinion and International Search Report for PCT Application No. PCT/CN2022/076321 dated Nov. 16, 2022.
Non-Final Office Action for U.S. Appl. No. 17/167,391 dated Feb. 17, 2023.

* cited by examiner

MOTOR MALFUNCTION MONITORING DEVICE, DRIVE MOTOR SYSTEM AND MOTOR MALFUNCTION MONITORING METHOD

CROSS REFERENCE TO RELATED APPLICATION

This application claims priority to Chinese patent application No. 202022639085.1 filed on Nov. 13, 2020 and Chinese patent application No. 202011273318.9 filed on Nov. 13, 2020. The content of all of the above applications is incorporated herein by reference in their entirety as a part of the present application.

FIELD

The present disclosure generally relates to an apparatus utilized in the field of oilfield operations, and more specifically, to a motor malfunction monitoring device, a drive motor system and a motor malfunction monitoring method.

BACKGROUND

At present, the electrically-driven apparatus is widely used in the field of oilfield operations. For example, the electrically-driven apparatus may be employed for electrically-driven fracturing, electrically-driven mixing, electrically-driven sand mixing, electrically-driven sand transportation, and other engineering operations. An electrically-driven apparatus typically includes a motor for supplying power, equipped with a variable frequency drive (VFD) (also referred to as a drive unit of the motor) regulating the power source for the motor in frequency and voltage. The VFD includes a rectifier, an inverter and a control circuit, where the control circuit detects operation status of the inverter and the rectifier and controls an input from the inverter to the motor to protect electrical components (e.g., the motor and the like) of the circuit. The control circuit of the VFD can monitor parameters on a current, voltage, and the like, of the motor, triggers an alarm when those parameters exceed predetermined normal threshold ranges, and then cuts off the power supply circuit.

SUMMARY

The objective of the present disclosure is to provide an electrically-driven apparatus used in a well site with a motor malfunction monitoring device and a motor control system. For an electrically-driven apparatus used in a well site, due to complicated material and vibration conditions in the environment, some components of the apparatus are vulnerable after a period of time, causing shutdown of the electrically-driven apparatus and further incurring huge time and labor costs. Therefore, there is a necessity to monitor and determine a malfunction for an electrically-drive apparatus used in a well site, and send a prompt to the same, so as to give engineers a necessary reminder to examine and repair the electrically-driven apparatus.

The motor malfunction monitoring device according to the present disclosure cannot only monitor the electrical status of a motor (e.g., whether a voltage or current is normal, or the like) but also can monitor status of mechanical components (e.g., bearings, bases, and the like) of the motor. In the meantime, the motor control system can further control the motor based on the above status.

In a first aspect of the present disclosure, there is provided a motor malfunction monitoring device for monitoring a malfunction of a drive motor in oilfield operations, comprising:

a signal acquisition module configured to acquire operation data of the drive motor, wherein the signal acquisition motor comprises a vibration signal acquisition unit and/or an electrical signal acquisition unit, the vibration signal acquisition unit comprises one or more vibration sensors for detecting transverse vibration and/or longitudinal vibration of a component to be detected of the drive motor, and/or the electrical signal acquisition unit comprises a voltage sensor and a current sensor for detecting a voltage and a current of the drive motor, respectively;

a data storage module storing therein a normal operation data spectrum library created when the drive motor runs normally; and a signal analysis module, wherein the signal analysis module is configured to extract an acquired operation data spectrum of the operation data acquired, compare the acquired operation data spectrum with a respective normal operation data spectrum in the normal operation data spectrum library to obtain a similarity, determine whether the similarity is less than a predetermined threshold, and determine that the drive motor fails when the similarity is less than the predetermined threshold.

Alternatively, the data storage module stores therein a database for malfunction spectrums created when the drive motor runs at different types of malfunctions, and the motor malfunction monitoring device further comprises a malfunction diagnosis module, and wherein, after the signal analysis module determines that the drive motor fails, the malfunction diagnosis module compares the acquired operation data spectrum with malfunction spectrums in the database for malfunction spectrums and diagnoses a malfunction type of the drive motor.

Alternatively, the data storage module is updated using operation data and/or the acquired operation data spectrums of the drive motor.

Alternatively, the data storage module expands the normal operation data spectrum library using the acquired operation data spectrum when the drive motor does not fail, and expands the database for malfunction spectrums using the acquired operation data spectrum when the drive motor fails.

Alternatively, the motor malfunction monitoring device comprises an alarming unit, wherein the alarming unit sends a malfunction alarm when the motor malfunction monitoring device determines that the drive motor fails.

Alternatively, the component to be detected comprises a bearing and a base of the drive motor.

In a second aspect of the present disclosure, there is further provided a drive motor system, comprising: a drive motor, a variable frequency drive for regulating an input current to the drive motor and a controller, characterized by further comprising the motor malfunction monitoring device according to any of embodiments of the present disclosure, wherein the controller controls, based on a diagnosis result of the motor malfunction monitoring device, the variable frequency drive to regulate the input current to the drive motor.

Alternatively, for an electrical signal of the drive motor, the controller controls the variable frequency drive to switch off the input current to the drive motor when either of the variable frequency drive and the motor malfunction monitoring device monitors that the drive motor fails.

In a third aspect of the present disclosure, there is also provided a motor malfunction monitoring method for monitoring a malfunction of a drive motor for oilfield operations, characterized by comprising steps of:

acquiring operation data of the drive motor, wherein the operation data comprise a transverse and/or a longitudinal vibration signal of a component to be detected of the drive motor, and/or a voltage and a current signal of the drive motor;

extracting an acquired operation data spectrum of the operation data acquired; and comparing the acquired operation data spectrum with a pre-stored, respective normal operation data spectrum in a normal operation data spectrum library of the drive motor to obtain a similarity, and determining that the drive motor fails when the similarity is less than a predetermined threshold.

Alternatively, the motor malfunction monitoring method further comprises:

when determining that the drive motor fails, comparing the acquired operation data spectrum with malfunction spectrums in a database for malfunction spectrums pre-stored created when the drive motor runs at different types of malfunctions, and diagnosing a malfunction type of the drive motor.

Alternatively, the motor malfunction monitoring method further comprises:

storing the operation data and/or the acquired operation data spectrum of the drive motor.

Alternatively, the motor malfunction monitoring method further comprises:

expanding the normal operation data spectrum library using the acquired operation data spectrum when the drive motor does not fail, and expanding the database for malfunction spectrums using the acquired operation data spectrum when the drive motor fails.

BRIEF DESCRIPTION OF THE DRAWINGS

For the sake of better understanding on the above and other objectives, features, advantages, and functions of the present disclosure, the preferred embodiments are provided with reference to the drawings. The same reference symbols refer to the same components throughout the drawings. It would be appreciated by those skilled in the art that the drawings are merely provided to illustrate preferred embodiments of the present disclosure, without suggesting any limitation to the protection scope of the present application, in which FIG. 1 schematically illustrates a motor malfunction monitoring device according to an embodiment of the present disclosure.

Figure 1:
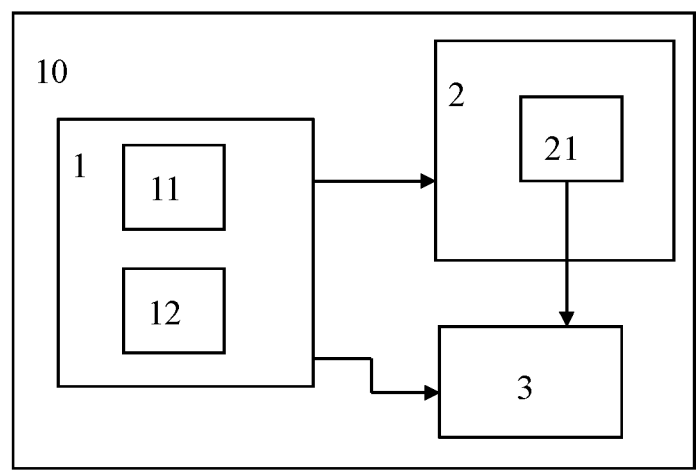

A LIST OF REFERENCE SIGNS 10, 10' motor malfunction monitoring device
1, 1' signal acquisition module
11, 11' vibration signal acquisition unit
12, 12' electrical signal acquisition unit
2, 2' data storage module
21, 21' database of normal operation spectrums
22' database for malfunction spectrums
3, 3' signal analysis module
4, 4' malfunction diagnosis module

DETAILED DESCRIPTION OF EMBODIMENTS

Reference now will be made to the drawings to describe in detail the embodiments of the present disclosure. What will be described herein will only involve preferred embodiments of the present disclosure, as well as other manners conceivable for those skilled in the art on the basis of the preferred embodiments of the present disclosure, which also fall into the scope claimed by the present disclosure.

The motor malfunction monitoring device as described therein is generally provided for monitoring malfunctions of a drive motor used in oilfield operations. FIG. 1 schematically illustrates a modular structure diagram of a motor malfunction monitoring device 10 according to an embodiment of the present disclosure. As shown in FIG. 1, the motor malfunction monitoring device 10 includes a signal acquisition module 1, a data storage module 2 and a signal analysis module. Specifically, the signal acquisition module 1 is responsible for acquiring operation data during the operation of the drive motor, where these operation data include an electrical signal of the drive motor, namely a current or voltage signal, and/or vibration signal of components to be detected. To this end, the signal acquisition module 1 may include an electrical signal acquisition unit 12 and/or a vibration signal acquisition unit 11, where the electrical signal acquisition unit 12, for example, can include voltage sensor(s) and current sensor(s) and be mounted at appropriate positions of the drive motor, as disclosed in the prior art, to detect and acquire the voltage signal and current signal of the drive motor. In addition, the vibration signal acquisition unit 11 may include one or more vibration sensors, where, depending on components of the drive motor and vibration directions to be detected, the vibration sensors may be mounted at the components to be detected, particularly along specific directions of the vibration, such that the vibration sensors can detect and acquire the vibration signals of the components in the specific directions. Within the scope of the present disclosure, since components of the drive motor often vibrate in transverse and longitudinal directions in case of failure, the vibration signal acquisition unit 11 is used to mainly acquire vibration in the transverse and longitudinal directions. It is noted that, within the scope of the present disclosure, "a transverse direction" refers to a direction parallel to a mounting plane of the drive motor and perpendicular to a longitudinal direction of the drive motor, and "a longitudinal direction" refers to a direction perpendicular to both of the mounting plane and the longitudinal direction of the drive motor. For example, within the scope of the present disclosure, depending on the components concerned and need to be detected, the vibration sensors of the vibration signal acquisition unit 11 may be mounted at the bearings and the bases of the drive motor to detect and acquire vibration of the bearings and the bases, for detecting whether there is abnormality, loosening or damage of the bearings, loosening of bases, and the like.

Although the vibration signal acquisition unit, for example, includes vibration sensors mounted at the bearings of the drive motor and the bases of the drive motor, as described above, vibration sensors may be mounted at other components of the drive motor, depending on the different components need to be detected and concerned, which also fall into the scope of the present disclosure.

The data storage module 2 of the motor malfunction monitoring device 10 stores therein a database 21 of normal operation spectrums during the normal operation of the drive motor. Specifically, the database 21 of normal operation spectrums includes therein operation data spectrums when the drive motor runs normally in different operating conditions, for example, transverse vibration signal spectrums, longitudinal vibration signal spectrums, voltage or current signal spectrums, and the like, of the components to be detected.

The signal analysis module 3 of the motor malfunction monitoring device 10 can perform processing and analysis on the operation data acquired by the signal acquisition module 1, extract acquired operation data spectrums of the acquired operation data, and then compare them with corresponding normal operation spectrums in the database to obtain a similarity therebetween. If the similarity is lower than a predetermined threshold, the signal analysis module determines that the drive motor fails. Specifically, for example, when the signal acquisition module 1 has acquired the current or voltage signals and the transverse and longitudinal vibration signals when the drive motor runs in a certain operating condition, the signal analysis module extracts spectrums of these signals and compares them with the current or voltage signal spectrums and the transverse and longitudinal vibration signal spectrums at the bearing when the drive motor runs normally in the corresponding operating condition to obtain a similarity therebetween. If the similarity is lower than a predetermined threshold, it is determined that the drive motor fails. The predetermined threshold as mentioned above may be predetermined based on factors, such as the operating status of the drive motor and the like.

Figure 2:
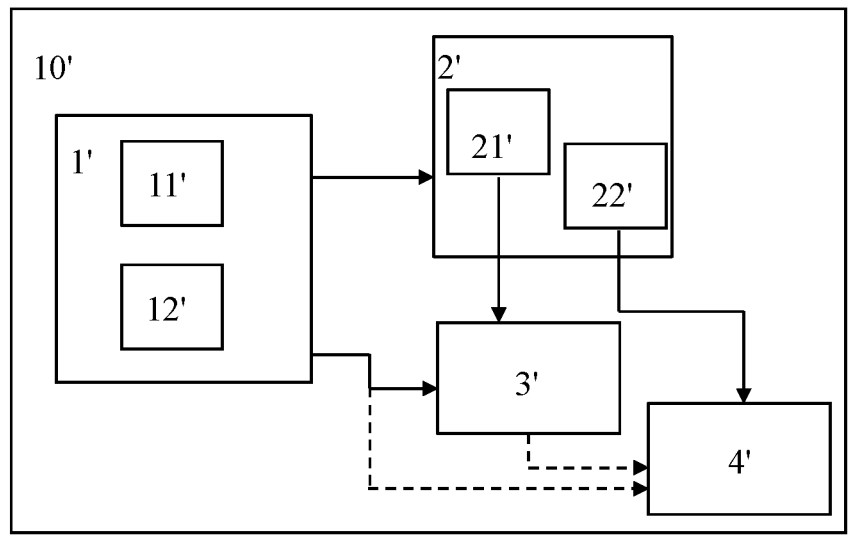
FIG. 2 schematically illustrates a motor malfunction monitoring device according to another embodiment of the present disclosure.

FIG. 2 schematically illustrates a motor malfunction monitoring device 10' according to another embodiment of the present disclosure. To avoid duplication, only differences between the embodiments as shown in FIG. 2 and the one in FIG. 1 will be described below. In order to differentiate the two embodiments, the reference symbols involved in FIG. 2 are represented with an additional Superscript "'", as compared with those in FIG. 1. As shown in FIG. 2, in addition to the modules in FIG. 1, the motor malfunction monitoring device 10' further includes a malfunction diagnosis module 4'. To be specific, when the signal analysis module 3 determines that the drive motor fails, the malfunction diagnosis module 4' further determines the malfunction type of the drive motor. With respect to the motor malfunction monitoring device 10' in the embodiment, the data storage module 2' further stores therein a database 22' for malfunction spectrums when the drive motor runs at different types of malfunctions, and the malfunction diagnosis module 4' compares the acquired operation data spectrums with the malfunction spectrums in the database and diagnoses the malfunction type of the drive motor. Specifically, the database 22' of malfunction spectrums stored in the data storage module 2' at least includes characteristic spectrums of operation data when the drive motor fails at different operating conditions, for example, characteristic spectrums of the drive motor when bearings, bases, or stator coils are loose, short circuit occurs between stator winding turns, and the like. The malfunction diagnosis module 4' compares the acquired operation data with those malfunction spectrums to find out a malfunction spectrum mostly similar to the acquired operation data, and then determines the specific malfunction type of the drive motor.

Alternatively, within the scope of the present disclosure, the data storage module 2, 2' is configured to store operation data and/or acquired operation data spectrums of the drive motor. Those spectrums may be stored in a local or remote memory of the data storage module 2, 2', which can be implemented by means of existing storage technique in the related fields. In this circumstance, alternatively, in some embodiments, the data storage module 2, 2' can further update and expand the database stored therein (i.e., the database of normal operation spectrums and the database for malfunction spectrums) by using operation data and/or acquired operation data spectrums of the drive motor. Specifically, the data storage module 2, 2' expands and updates the database of normal operation spectrums by using the acquired operation data spectrums when the drive motor does not fail, and expands and updates the database for malfunction spectrums by using the acquired operation data spectrums when the drive motor fails. More specifically, the acquired operation data spectrums are respectively categorized according to the malfunction categories into which they fall.

Alternatively, in some embodiments of the present disclosure, the motor malfunction monitoring device 10, 10' may further include an alarming unit which can send out an alarm based on the malfunction determined by the motor malfunction monitoring device 10, 10', more specifically, a respective malfunction alarm (e.g., warning light, alarm sound, alarm information, or the like) corresponding to the malfunction type.

In the present disclosure, there is further provided a drive motor system, including: a drive motor, a variable frequency drive (also referred to as drive unit) that can regulate the current or voltage of the drive motor, a motor malfunction monitoring device and a controller, where the motor malfunction monitoring device can be configured in the form of the motor malfunction monitoring device 10, 10' according to any of the embodiments of the present disclosure. The controller controls the drive motor, based on the drive motor's malfunction information obtained by the motor malfunction monitoring device 10, 10' (i.e. presence or absence of a malfunction in the drive motor and/or the malfunction type of the drive motor). For example, in some malfunctions, the controller stops the drive motor. It is noted that, under this circumstance, the variable frequency drive monitors the current and voltage of the drive motor as mentioned in the prior art, but since the motor malfunction monitoring device is included in the present disclosure, the variable frequency drive may be configured to only regulate the input current to the drive motor under the control of the controller, without the necessity to monitor the current and voltage of the drive motor.

In addition, within the scope of the present disclosure, the variable frequency drive is configured as a conventional variable frequency drive employed in the related technical fields of drive motors, which may include a rectifier, an inverter, a control circuit assembly for detecting the current or voltage of the drive motor and regulating an input current to the drive motor, and the like. Specifically, the controller controls, based on the malfunction of the drive motor determined by the motor malfunction monitoring device 10, 10', the variable frequency drive to regulate an input current or voltage to the drive motor.

Alternatively, in some embodiments of the present disclosure, for the electrical signals (i.e., current or voltage) of the drive motor, when one of the variable frequency drive and the motor malfunction monitoring device 10, 10' monitors an electrical signal malfunction (i.e., abnormality), the controller controls the variable frequency drive to cut off the input current to the drive motor. In other words, if the voltage or current malfunction cannot be detected due to failure of the variable frequency drive or one of the voltage sensor and the current sensor in the motor malfunction monitoring device, the controller can switch off the input current to the drive motor for the sake of security, rather than performing control based on the monitored result from one of the above. Such redundant determination avoids the deficiency of misjudging the malfunction of the drive motor due to circuit failure in the variable frequency drive.

Figure 3:
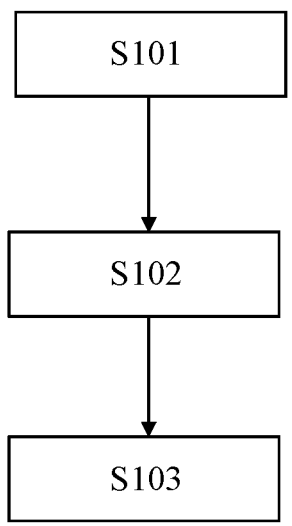
FIG. 3 schematically illustrates a motor malfunction monitoring method according to an embodiment of the present disclosure.

FIG. 3 schematically illustrates a flowchart of a motor malfunction monitoring method according to the present disclosure. The motor malfunction monitoring method involved herein is particularly used to monitor a malfunction of a drive motor in oilfield operations, including steps of:

S101: acquiring operation data of the drive motor, where the operation data include a transverse and/or a longitudinal vibration signal of components to be detected of the drive motor, and/or an electrical signal, namely a voltage or current signal, of the drive motor;

As aforementioned, depending on different components need to be detected, the transverse and longitudinal vibration signals at the bearings and the bases of the drive motor may be acquired, to detect and acquire vibration of the bearings and bases of the drive motor for subsequent determination of a malfunction, such as abnormality, loosening or damage of the bearings, loosening of bases, and the like.

S102: extracting acquired operation data spectrums of the operation data acquired;

Specifically, the operation data acquired are processed and analyzed, and the acquired operation data spectrums of the operation data acquired are extracted.

S103: comparing the acquired operation data spectrums with normal operation data spectrums pre-stored in the database of normal operation spectrums of the drive motor to obtain a similarity, and determines that the drive motor fails when the similarity is less than a predetermined threshold.

Specifically, the database of normal operation spectrums during the normal operation of the drive motor is pre-stored. More specifically, the database of normal operation spectrums includes operation data spectrums (e.g., transverse vibration signal spectrums, longitudinal vibration signal spectrums, voltage or current signal spectrums, and the like, of components to be detected) when the drive motor runs normally under different operating conditions.

In other words, for example, after the current or voltage electrical signals and transverse and longitudinal vibration signals at the bearings under a certain operating condition of the drive motor are acquired, the spectrums of these signals are extracted and compared with the current or voltage signal spectrums and the transverse and longitudinal signal spectrums in the corresponding normal operating condition to obtain a similarity therebetween, and it is determined that the drive motor fails if the similarity is less than a predetermined threshold. The predetermined threshold as mentioned above may be predetermined based on factors, such as the use status of the drive motor and the like.

Figure 4:
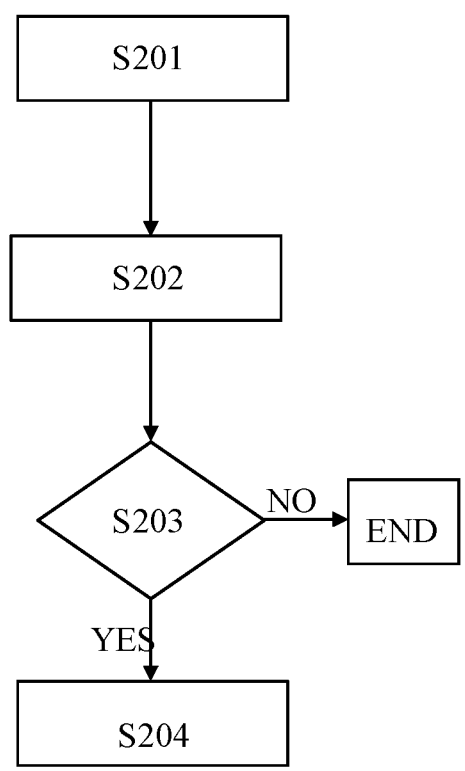
FIG. 4 schematically illustrates a motor malfunction monitoring method according to another embodiment of the present disclosure.

FIG. 4 schematically illustrates a flowchart of a motor malfunction monitoring method according to another embodiment of the present disclosure, where steps S201 to S203 are identical with those in FIG. 3, which are omitted herein.

In addition, the motor malfunction monitoring method as shown in FIG. 4 further includes steps of:

S204: when determining that the drive motor fails, comparing the acquired operation data spectrums with the malfunction spectrums pre-stored in the database for malfunction spectrums under different malfunction types of the drive motor, and diagnosing a malfunction type of the drive motor.

Specifically, determining that the drive motor fails further includes determining a malfunction type of the drive motor. The database for malfunction spectrums created when the drive motor fails at different types of malfunctions is pre-stored, including at least characteristic spectrums of operation data when the drive motor fails at different operating conditions, for example, characteristic spectrums of the drive motor when bearings, bases, or stator coils are loose, short circuit occurs between stator winding turns, and the like. Then, the acquired operation data spectrums are compared with those malfunction spectrums, to determine malfunction spectrums mostly corresponding to the acquired operation data spectrums and thus determine a specific malfunction type of the drive motor.

Alternatively, in some embodiments of the present disclosure, the motor malfunction monitoring method further includes a step of:

storing operation data and/or the acquired operation data spectrums of the drive motor.

In other words, the database of normal operation spectrums and the database for malfunction spectrums can be updated and expanded by using the operation data and/or the spectrums of the acquired operation data of the drive motor. The database of normal operation spectrums is expanded and updated by using the acquired operation data spectrums when the drive motor does not fail, while the database for malfunction spectrums is expanded and updated by using the acquired operation data spectrums when the drive motor fails. More specifically, the acquired operation data spectrums are categorized according to the malfunction categories into which they fall.

The above description on multiple embodiments of the present disclosure is provided to the ordinary skilled in the related field for illustration, without any intention to be exclusive or limited to a single embodiment of the present disclosure. Given the teaching, the ordinary skilled in the art would envision multiple types of substitution and variation of the present disclosure. Therefore, although some alternative embodiments are described herein, the ordinary skilled in the art would understand or easily devise other embodiments. The present disclosure intends to cover all substitution, modification and variation of the embodiments described herein, as well as other embodiments falling within the spirits and scope described above.

We claim:

1. A motor malfunction monitoring device for monitoring a malfunction of a drive motor, comprising:

vibration sensors for detecting for one or more components of the drive motor transverse vibration in a direction parallel to a mounting plane of the drive motor and perpendicular to a longitudinal direction of the drive motor and longitudinal vibration in a direction perpendicular to both the mounting plane and the longitudinal direction of the drive motor;

a voltage sensor and a current sensor for detecting a voltage and a current of the drive motor, respectively; and a data storage storing a database of normal operation spectrums of the transverse vibration, the longitudinal vibration, the voltage, and the current during a normal operation of the drive motor;

wherein the motor malfunction monitoring device is configured to acquire operation data of the drive motor, extract acquired operation data spectrums of the acquired operation data, compare the acquired operation data spectrums with corresponding normal operation spectrums to obtain a similarity, and when the similarity is lower than a predetermined threshold, determine that the drive motor fails; and wherein the data storage stores a database of known malfunction spectrums of different types of malfunctions of the drive motor, and the motor malfunction monitoring device is further configured to, when determining that the drive motor fails, compare the acquired operation data spectrums with the known malfunction spectrums and determine a malfunction type of the drive motor.

2. The motor malfunction monitoring device according to claim 1, wherein the data storage is updated with the acquired operation data spectrums of the drive motor.

3. The motor malfunction monitoring device according to claim 2, wherein the data storage expands the database of normal operation spectrums with the acquired operation data spectrums in the normal operation of the drive motor, and expands the database for malfunction spectrums with the acquired operation data spectrums in the malfunction of the drive motor.

4. The motor malfunction monitoring device according to claim 1, wherein the motor malfunction monitoring device comprises an alarm device, wherein the alarm device sends out an alarm when the motor malfunction monitoring device determines that the drive motor fails.

5. The motor malfunction monitoring device according to claim 2, wherein the motor malfunction monitoring device comprises an alarm device, wherein the alarm device sends out an alarm when the motor malfunction monitoring device determines that the drive motor fails.

6. The motor malfunction monitoring device according to claim 3, wherein the motor malfunction monitoring device comprises an alarm device, wherein the alarm device sends out an alarm when the motor malfunction monitoring device determines that the drive motor fails.

7. The motor malfunction monitoring device according to claim 1, wherein the one or more components to be detected comprise bearings and bases of the drive motor.

8. A drive motor system, comprising: a drive motor, a variable frequency drive for regulating an input current to the drive motor, and a controller, wherein the drive motor system further comprises the motor malfunction monitoring device according to claim 1, wherein the controller controls, based on a determining result of the motor malfunction monitoring device, the variable frequency drive to regulate the input current to the drive motor.

9. The drive motor system according to claim 8, wherein the controller controls the variable frequency drive to cut off the input current when the motor malfunction monitoring device determines that the drive motor fails.

10. A motor malfunction monitoring method for monitoring a malfunction of a drive motor, comprising:
pre-storing a database of normal operation spectrums obtained during a normal operation of the drive motor;
detecting for one or more components of the drive motor transverse vibration in a direction parallel to a mounting plane of the drive motor and perpendicular to a longitudinal direction of the drive motor and longitudinal vibration in a direction perpendicular to both the mounting plane and the longitudinal direction of the drive motor;
detecting a voltage and a current of the drive motor, respectively;
acquiring operation data of the drive motor, wherein the acquired operation data comprises a transverse vibration signal corresponding to the transverse vibration, a longitudinal vibration signal corresponding to the longitudinal vibration, a voltage signal corresponding to the voltage, and a current signal corresponding to the current;
extracting acquired operation data spectrums of the acquired operation data; and
comparing the acquired operation data spectrums with corresponding normal operation spectrums in the pre-stored database of normal operation spectrums during the normal operation of the drive motor, to obtain a similarity, when the similarity is lower than a predetermined threshold, determining that the drive motor fails; and
when determining that the drive motor fails, comparing the acquired operation data spectrums with known malfunction spectrums stored in a database comprising known malfunction spectrums of different types of malfunctions of the drive motor, and determining a malfunction type of the drive motor.

11. The motor malfunction monitoring method according to claim 10, further comprising: storing the acquired operation data spectrums of the drive motor.

12. The motor malfunction monitoring method according to claim 11, further comprising: expanding the database of normal operation spectrums with the acquired operation data spectrums in the normal operation of the drive motor, and expanding the database for malfunction spectrums with the acquired operation data spectrums in the malfunction of the drive motor.

\* \* \* \* \*